United States Patent
Okoroanyanwu et al.

(10) Patent No.: US 6,589,709 B1
(45) Date of Patent: *Jul. 8, 2003

(54) PROCESS FOR PREVENTING DEFORMATION OF PATTERNED PHOTORESIST FEATURES

(75) Inventors: Uzodinma Okoroanyanwu, Mountain View, CA (US); Jeffrey A. Shields, Sunnyvale, CA (US); Chih-Yuh Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 90 days.

This patent is subject to a terminal disclaimer.

(21) Appl. No.: 09/819,692

(22) Filed: Mar. 28, 2001

(51) Int. Cl.[7] .................................................. G03F 7/00
(52) U.S. Cl. .................. 430/296; 430/313; 430/328; 250/492.3
(58) Field of Search ............................ 430/311, 296, 430/313, 327, 328; 250/492.2, 492.21, 492.3

(56) References Cited

U.S. PATENT DOCUMENTS

| | | | |
|---|---|---|---|
| 3,997,367 A | 12/1976 | Yau | 148/1.5 |
| 4,394,211 A | 7/1983 | Uchiyama et al. | 156/628 |
| 4,446,222 A | 5/1984 | Kress | 430/307 |
| 5,003,178 A | 3/1991 | Livesay | 250/492.3 |
| 5,468,595 A | 11/1995 | Livesay | 430/296 |
| 5,876,903 A | 3/1999 | Ng et al. | 430/313 |
| 5,962,195 A | 10/1999 | Yen et al. | 430/316 |
| 5,965,461 A | 10/1999 | Yang et al. | 438/717 |
| 5,994,225 A | 11/1999 | Liu et al. | 430/694 |
| 6,103,457 A | 8/2000 | Gabriel | 430/318 |
| 6,107,172 A | 8/2000 | Yang et al. | 438/585 |
| 6,110,837 A | 8/2000 | Linliu et al. | 438/723 |
| 6,174,818 B1 | 1/2001 | Tao et al. | 438/733 |
| 6,197,687 B1 | 3/2001 | Buynoski | 438/671 |
| 6,200,903 B1 | 3/2001 | Oh et al. | 438/705 |
| 6,232,048 B1 | 5/2001 | Buynoski et al. | 430/328 |
| 6,319,655 B1 | 11/2001 | Wong et al. | 430/311 |
| 6,358,670 B1 | 3/2002 | Wong et al. | 430/296 |
| 6,395,447 B1 | 5/2002 | Ishii et al. | 430/191 |
| 6,420,097 B1 | 7/2002 | Pike et al. | 430/313 |

OTHER PUBLICATIONS

Livesay, W. R., "*Large–area electron–beam source,*" Journal of Vacuum Science & Technology B, vol. 11, No. 6, Nov./Dec. 1993, pp. 2304–2308, American Vacuum Society.

Yang, J. J. et al, "*Electron Beam Processing for Spin–on Polymers and its Applications To Back–End–of–Line (BEOL) Integration,*" Materials Research Society Symposium Proceedings, vol. 511, 1998, pp. 49–55, Materials Research Society.

Ross et al, "*Plasma Etch Characteristics of Electron Beam Processed Photoresist,*"The Society of Photo–Optical Instrumentation Engineers, vol. 2438, 1995, pp. 803–816, SPIE–The International Society for Optical Engineering.

Grün, Von A. E., "*Lumineszenz–photometrische Messungen der Energieabsorption im Strahlungsfeld von Elektronenquellen Eindimensionaler Fall in Luft,*" Zeitschrift für Naturforschung, vol. 12a, 1957, pp. 89–95, Publisher: Zeitschrift für Natuforschung; full English Translation attached (11 pgs.).

Chiong K.G. et al. "Resist Contrast Enhancement in High Resolution Electron Beam Lithography", Journal of Vacuum Science and Technology: Part B, American Institute of Physics, New York, US, vol. 7, No. 6.

Patent Abstracts of Japan, vol. 1999, No. 09, Jul. 30, 1999 & JP 11 097328 A (Toshiba Corp), Apr. 9, 1999 abstract.

Primary Examiner—Kathleen Duda
(74) Attorney, Agent, or Firm—Foley & Lardner

(57) ABSTRACT

A process for preventing deformation of patterned photoresist features during integrated circuit fabrication is disclosed herein. The process includes stabilizing the patterned photoresist features by a flood electron beam before one or more etch processes. The stabilized patterned photoresist features resist pattern bending, breaking, collapsing, or deforming during a given etch process. The electron beam stabilization can be applied to the patterned photoresist features a plurality of times as desired.

20 Claims, 8 Drawing Sheets

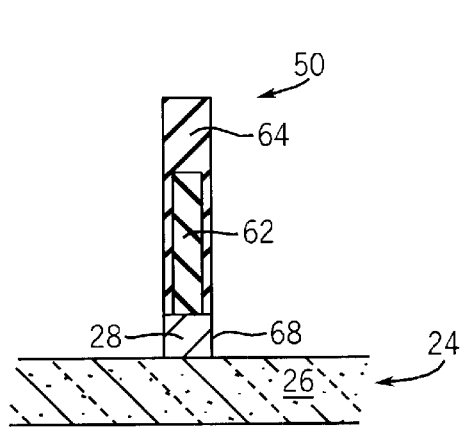
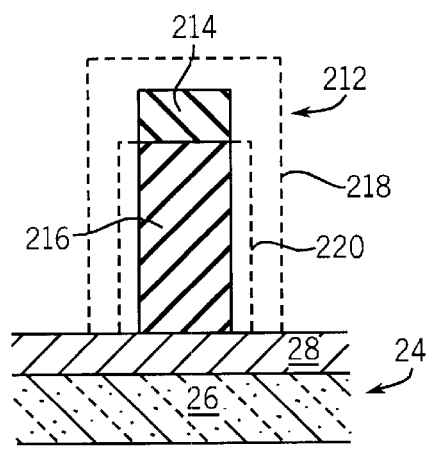
FIG. 7     FIG. 9
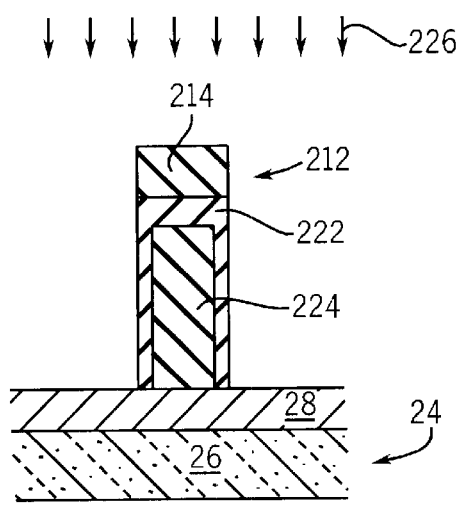
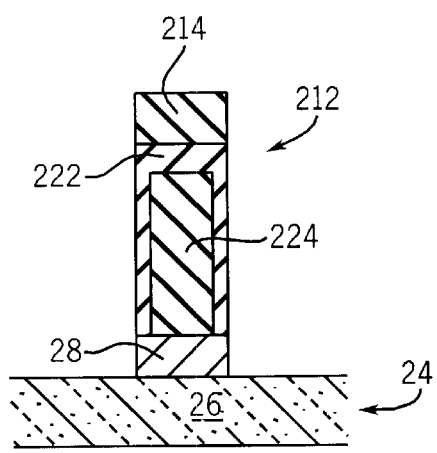
FIG. 10     FIG. 11

PROCESS FOR PREVENTING DEFORMATION OF PATTERNED PHOTORESIST FEATURES

CROSS REFERENCE TO RELATED APPLICATIONS

The present application is related to U.S. application Ser. No. 09/819,342 by Shields et al., entitled "Process for Forming Sub-Lithographic Photoresist Features by Modification of the Photoresist Surface;" U.S. application Ser. No. 09/820,143 by Okoroanyanwu et al., entitled "Improving SEM Inspection and Analysis of Patterned Photoresist Features;" U.S. application Ser. No. 09/819,344 by Okoroanyanwu et al., entitled "Process for Reducing the Critical Dimensions of Integrated Circuit Device Features;" U.S. application Ser. No. 09/819,343 by Gabriel et al., entitled "Selective Photoresist Hardening to Facilitate Lateral Trimming;" and U.S. application Ser. No. 09/819,552 by Gabriel et al., entitled "Process for Improving the Etch Stability of Ultra-Thin Photoresist," all filed on an even date herewith and assigned to the Assignee of the present application.

FIELD OF THE INVENTION

The present invention relates generally to integrated circuits (ICs). More particularly, the present application relates to a process for preventing deformation of patterned features on a layer of photoresist material utilized for IC fabrication.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, gate lengths in field-effect transistors and widths of conductive lines, is driven by lithographic performance.

IC fabrication often utilizes a mask or reticle to form an image or pattern on one or more layers comprising a semiconductor wafer. Radiation is provided or reflected off the mask or reticle to form the image on the semiconductor wafer. The wafer is correspondingly positioned to receive the radiation transmitted through or reflected off the mask or reticle. The radiation can be light at a wavelength in the ultraviolet (UV), vacuum ultraviolet (VUV), deep ultraviolet (DUV), or extreme ultraviolet (EUV) range. The radiation can also be a particle beam such as an x-ray beam, an electron beam, etc.

Typically, the image on the mask or reticle is projected and patterned onto a layer of photoresist material disposed over the wafer. The areas of the photoresist material upon which radiation is incident undergo a photochemical change to become suitably soluble or insoluble in a subsequent development process. In turn, the patterned photoresist layer is used to define doping regions, deposition regions, etching regions, and/or other structures comprising the IC.

As patterned photoresist features achieve ever smaller lateral dimensions, its aspect ratio (i.e., height/width) correspondingly increases. Unfortunately, patterned photoresist features with aspect ratios $\geq 3.0$ have a tendency to mechanically or physically deform during etch processes. As shown in FIGS. 1A–1D, a patterned photoresist feature 100 (e.g., a conductive line) undergoing an etch process (e.g., a resist trimming process or an etch process involving an underlying layer of the wafer) can suffer a number of failure mechanisms, such as, a pattern bending 102, a pattern breakage 104, or a pattern collapse 106. Such mechanical deformations are caused by capillary forces, inadequate inherent mechanical stability of feature 100, and/or the impact of etchant species on feature 100.

This tendency toward mechanical deformation is even more prevalent in photoresist materials that inherently have poor mechanical stability. Unfortunately, photoresist materials designed for shorter wavelength lithography exhibit poor mechanical stability. For example, currently available 193 nanometer (nm) photoresist materials based on acrylate and cyclo-olefin polymers have low mechanical stability compared to 248 nm photoresist materials based on phenolic polymers.

Since poor mechanical stability increases the likelihood of mechanical deformations during a given etch process, mechanical stability also correlates with etch stability. And indeed, 193 nm photoresist materials have a lower etch stability in comparison to their 248 nm counterparts and are more difficult to maintain pattern integrity through an etch process. Accordingly, achieving desirable small lateral dimensions and successful pattern transfer to the underlying layer(s) of the wafer with patterned photoresist features having poor etch stability is difficult.

Thus, there is a need for a process for preventing mechanical deformation of patterned photoresist features during etch processing.

There is a further need for a process for increasing the mechanical stability of patterned photoresist features. There is still a further need for a process for increasing the etch stability of patterned photoresist features.

BRIEF SUMMARY OF THE INVENTION

One exemplary embodiment relates to an integrated circuit fabrication process. The process includes stabilizing a feature patterned on a photoresist layer with an electron beam. The process further includes etching at least one of the photoresist layer and the substrate. The photoresist layer is disposed over a substrate. The stabilizing step is performed before the etching step. The feature patterned on the photoresist layer at the etching step has an aspect ratio greater than or equal to 3.0, a vertical thickness greater than 300 nm, or is comprised of an acrylate, alicyclic, or cyclo-olefin based polymer.

Another exemplary embodiment relates a method of maintaining pattern integrity during an integrated circuit fabrication. The integrated circuit fabrication includes a feature patterned on a photoresist layer and at least one potentially pattern deforming processing step. The method includes preventing the feature patterned on the photoresist layer from deforming using a flood electron beam. The method further includes configuring the conditions of the flood electron beam depending on a type of material comprising the photoresist layer, characteristics of the at least one potentially pattern deforming processing step, a vertical thickness of the photoresist layer, or a lateral dimension of the feature patterned on the photoresist layer. The feature patterned on the photoresist layer is selectively exposed to the flood electron beam before at least one potentially pattern deforming processing step.

Still another exemplary embodiment relates to a feature patterned on a photoresist layer. The feature includes a cured region. The cured region prevents the feature from at least one of bending, breaking, collapsing, and deforming during a subsequent etch process.

BRIEF DESCRIPTION OF THE DRAWINGS

The exemplary embodiments will become more fully understood from the following detailed description, taken in conjunction with the accompanying drawings, wherein like reference numerals denote like elements, in which:

FIG. 7 is a cross-sectional view of the wafer illustrated in FIG. 6, showing an underlying layer etching step;

FIG. 9 is a cross-sectional view of a wafer, showing a resist trimming step;

FIG. 10 is a cross-sectional view of the wafer illustrated in FIG. 9, showing a second electron beam exposure step;

FIG. 11 is a cross-sectional view of the wafer illustrated in FIG. 10, showing an underlying layer etching step;

DETAILED DESCRIPTION OF THE EXEMPLARY EMBODIMENTS

In one embodiment of the present invention, an advantageous process for preventing mechanical or physical deformation of features patterned on a photoresist layer during etch processing is provided. The advantageous process improves the mechanical and etch stability of features patterned on the photoresist layer such that mechanical deformation, such as, pattern bending, breakage, or collapse, will not occur. By stabilizing the features against such failure mechanisms, the integrity of the features is maintained and pattern transfer to the underlying layer(s) occur successfully.

The advantageous process comprises exposing or treating the features lithographically patterned on a photoresist layer to a flood electron beam before an etch process (e.g., resist trimming process or etching an underlying layer) which may cause mechanical deformation of the features. Depending on the parameters of the flood electron beam exposure, a certain depth of each of the features is chemically altered to better withstand the negative impacts of the etch process and/or facilitate the etch process. Since the advantageous process may be implemented one or more times and at various points within an integrated circuit (IC) fabrication process, several embodiments will be described with respect to process flow diagrams shown in FIGS. 2, 8, 12, and 16.

Figure 1A:
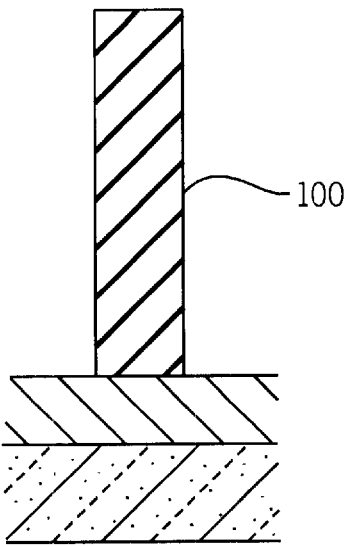
FIG. 1A is a cross-sectional view of a wafer, showing a patterned photoresist feature.
Figure 1B:
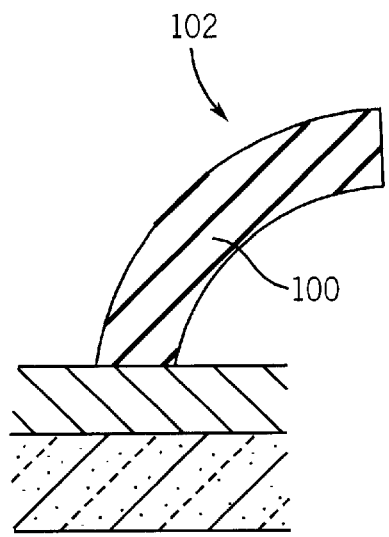
FIG. 1B is a cross-sectional view of the wafer illustrated in FIG. 1A, showing a pattern bending during an etch process.
Figure 1C:
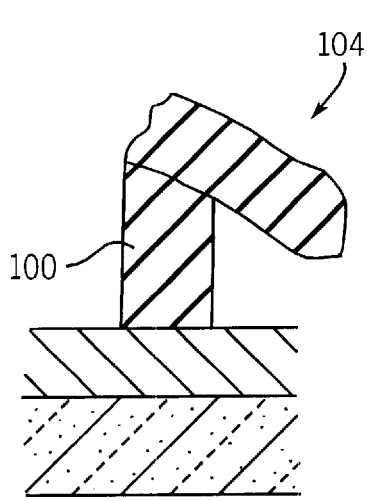
FIG. 1C is a cross-sectional view of the wafer illustrated in FIG. 1A, showing a pattern breakage during the etch process.
Figure 1D:
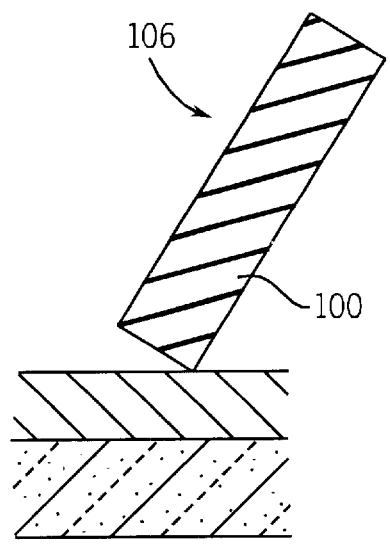
FIG. 1D is a cross-sectional view of the wafer illustrated in FIG. 1A, showing a pattern collapse during the etch process.
Figure 2:
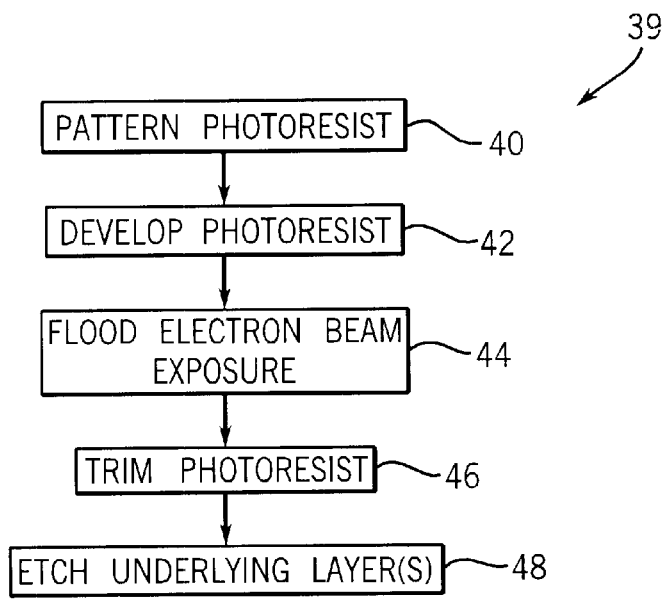
FIG. 2 is a process flow diagram showing an electron beam stabilization process in accordance with one exemplary embodiment.

In one embodiment, a process flow 39 shown in FIG. 2 includes a patterning step 40, a developing step 42, an electron beam exposure step 44, a resist trimming step 46, and an underlying layer etching step 48.

Figure 3:
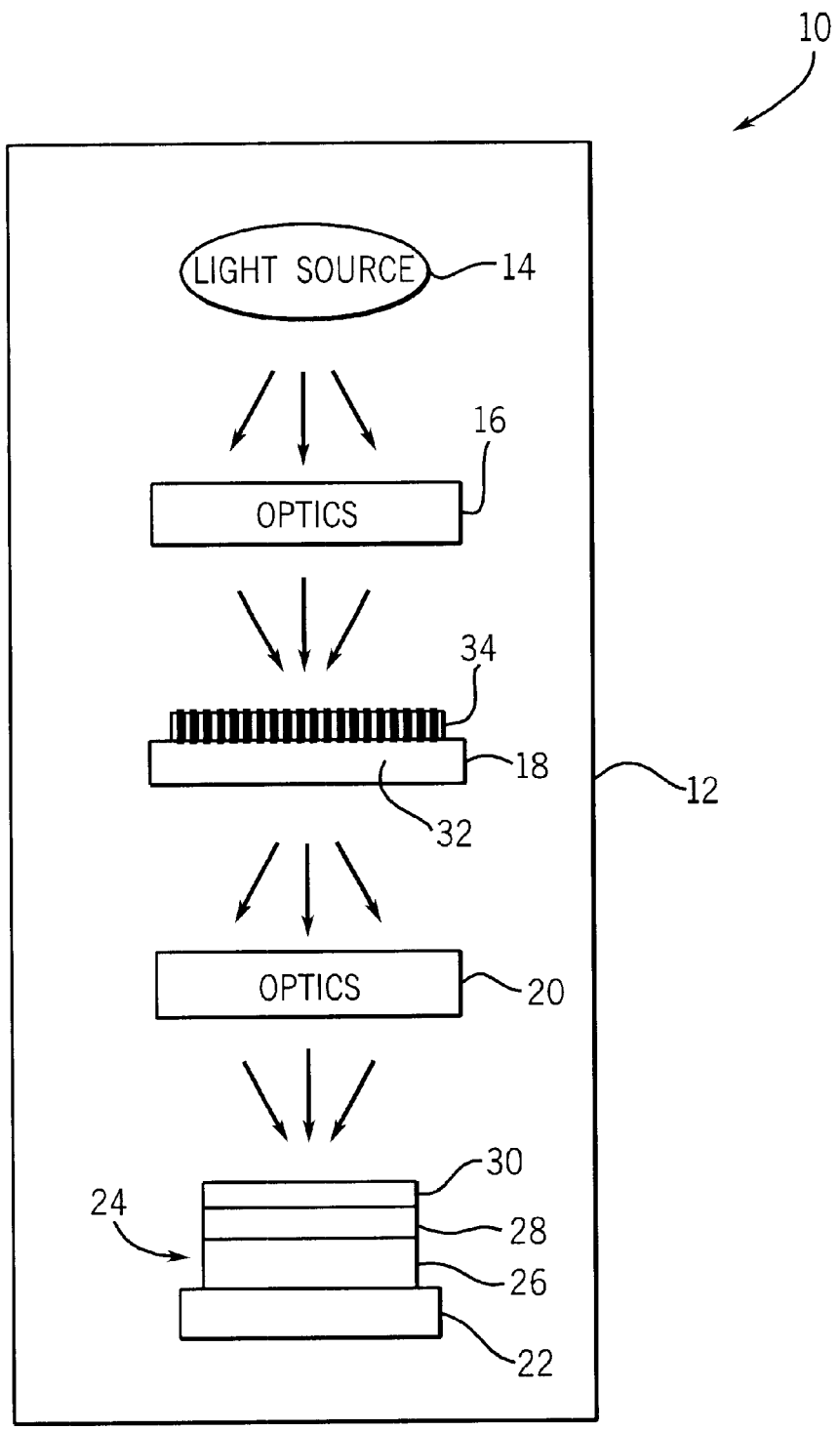
FIG. 3 is a general schematic block diagram of a lithographic system for patterning a wafer in accordance with an exemplary embodiment.

Patterning step 40 is carried out using a lithography system 10, as shown in FIG. 3. Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to a wafer 24 positioned in lithography system 10. Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea.

Wafer 24 includes a substrate 26, a layer 28, and a photoresist layer 30. Photoresist layer 30 is disposed over layer 28, and layer 28 is disposed over substrate 26. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, interconnects, vias, doped regions, etc., and can further include devices, such as, transistors, microactuators, microsensors, capacitors, resistors, diodes, etc.

Layer 28 can be an insulative layer, a conductive layer, a barrier layer, or other layer of material to be etched, doped, or layered. In one embodiment, layer 28 can comprise one or more layers of materials, such as, a polysilicon stack comprised of a plurality of alternating layers of titanium silicide, tungsten silicide, cobalt silicide materials, etc. In another embodiment, layer 28 is a hard mask layer, such as, a silicon nitride layer or a metal layer. The hard mask layer can serve as a patterned layer for processing substrate 26 or for processing a layer upon substrate 26. In yet another embodiment, layer 28 is an anti-reflective coating (ARC). Substrate 26 and layer 28 are not described in a limiting fashion, and can each comprise a conductive, semiconductive, or insulative material.

Photoresist layer 30 can comprise a variety of photoresist chemicals suitable for lithographic applications. Photoresist layer 30 is selected to have photochemical reactions in response to electromagnetic radiation emitted from light source 14. Materials comprising photoresist layer 30 can include, among others, a matrix material or resin, a sensitizer or inhibitor, and a solvent. Photoresist layer 30 is preferably a chemically amplified, positive or negative tone, organic-based photoresist. Photoresist layer 30 may be, but is not limited to, an acrylate-based polymer, an alicyclic-based polymer, a phenolic-based polymer, or a cyclo-olefin-based polymer. For example, photoresist layer 30 may comprise PAR700 photoresist manufactured by Sumitomo Chemical Company. Photoresist layer 30 is deposited, for example, by spin-coating over layer 28. Photoresist layer 30 is provided at a thickness of less than 1.0 $\mu$m.

Chamber 12 of lithographic system 10 can be a vacuum or low pressure chamber for use in ultraviolet (UV), vacuum ultraviolet (VUV), deep ultraviolet (DUV), extreme ultraviolet (EUV), x-ray, or other types of lithography. Chamber 12 can contain any of numerous types of atmospheres, such as, nitrogen, etc. Alternatively, chamber 12 can be configured to provide a variety of other patterning scheme.

Light source 14 provides light or electromagnetic radiation through condenser lens assembly 16, mask or reticle 18, and objective lens assembly 20 to photoresist layer 30. Light source 14 is an excimer laser, in one embodiment, having a wavelength of 365 nm, 248 nm, 193 nm, 157 nm, or 126 nm, or a soft x-ray source having a wavelength of 13.4 nm. Alternatively, light source 14 may be a variety of other light sources capable of emitting radiation having a wavelength in the ultraviolet (UV), vacuum ultraviolet (VUV), deep ultraviolet (DUV), extreme ultraviolet (EUV), x-ray or other wavelength range.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

Mask or reticle 18 is a binary mask in one embodiment. Mask or reticle 18 includes a translucent substrate 32 (e.g., glass or quartz) and an opaque or absorbing layer 34 (e.g., chromium or chromium oxide) thereof. Absorbing layer 34 provides a pattern or image associated with a desired circuit pattern, features, or devices to be projected onto photoresist layer 30. Alternatively, mask or reticle 18 may be an attenuating phase shift mask, an alternating phase shift mask, or other type of mask or reticle.

Figure 4:
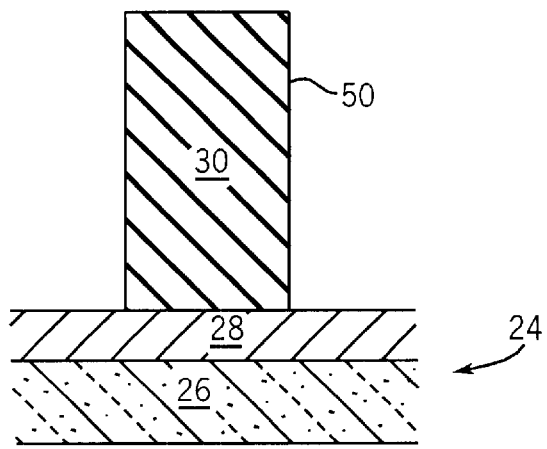
FIG. 4 is a cross-sectional view of the wafer illustrated in FIG. 3, showing a developing step.

Utilizing lithographic system 10, the pattern or image on mask or reticle 18 is projected onto and patterned on photoresist layer 30 of wafer 24. Next, in developing step 42, wafer 24 is exposed to a developer, as is well-known in the art, to develop the pattern on photoresist layer 30. Referring to FIG. 4, a cross-sectional view of a portion of wafer 24 after developing step 42 is shown. The developed pattern includes a feature 50.

After photoresist layer 30 has been developed but before features thereon are transferred onto any of the underlying layers, such as layer 28, electron beam exposure step 44 is performed. Wafer 24 may be removed from chamber 12 and placed within a different chamber and/or a different environment which provides electron beam tools. Alternatively, chamber 12 may be configured to include additional chambers and/or tools suitable to perform step 44.

Figure 5:
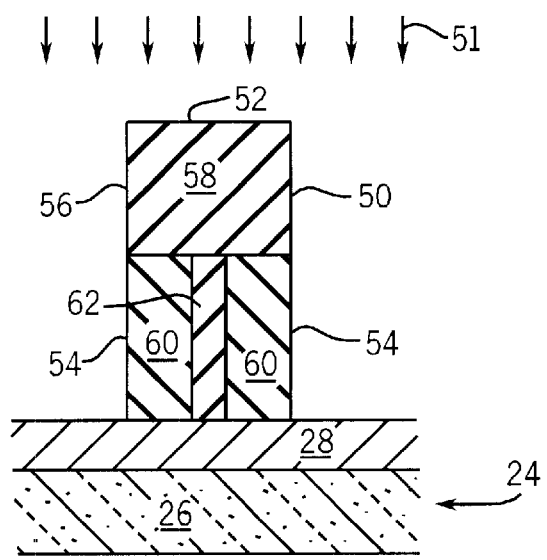
FIG. 5 is a cross-sectional view of the wafer illustrated in FIG. 4, showing an electron beam exposure step.

In FIG. 5, there is shown wafer 24 undergoing electron beam exposure step 44. A flood electron beam 51 impinges on the exposed surfaces of wafer 24 and chemically transforms or modifies such exposed surfaces to a certain depth. In feature 50, a top surface or region 52 and sidewalls or side regions 54 are transformed into a shell 56. Shell 56 is comprised of a treated top region 58 and treated side regions 60. Due to the characteristics of flood electron beam 51, to be described in greater detail hereinafter, the depth (i.e., vertical thickness) of treated top region 58 is typically greater than the depth (i.e., horizontal thickness) of treated side regions 60. Hence, upon completion of step 44, feature 50 comprises shell 56 and an untreated region 62. Untreated region 62 is encapsulated from underneath by layer 28 and on all other sides or faces by shell 56.

Alternatively, although not shown, shell 56 may extend throughout feature 50 such that after step 44, all of feature 50 is transformed or cured by electron beam 51. Electron beam 51 may be selectively configured to form a desirable depth of shell 56.

Electron beam 51 is preferably emitted from an extended area electron source (not shown) and is a uniform collimated beam that is flood exposed over the entire wafer 24 at a normal angle of incidence. The extended area electron source is of the cold cathode type and generates electron beam 51 from the energetic impact of ions against a suitable metal. An example of an extended area electron source suitable to generate electron beam 51 is manufactured by Electron Vision Corporation of San Diego, Calif.

For approximately normal angles of incidence, more electrons impinge top region 52 than side regions 54. Hence, the vertical thickness of treated top region 58 is typically greater than the horizontal thickness of each of treated side regions 60. It is also contemplated that electron beam 51 may be provided at other angles of incidence and/or at varying degrees of collimation to correspondingly affect the geometry of shell 56.

The electron beam flood exposure conditions (e.g., beam current, dose, and accelerating voltage) are selected such that layer 30 will not melt and flow, which will cause distortions in feature 50. Instead, conditions are selected to cause molecules of layer 30 which interact with electron beam 51 to undergo a chemical change, i.e., cross-linking, to the extent that the functional groups of the polymer material comprising such molecules become decomposed. Shell 56 is representative of a decomposed region of layer 30. The portion of feature 50 that electron beam 51 is unable to penetrate or bombard, i.e., untreated region 62, remains unaffected (i.e., the polymer functional groups of untreated region 62 are not cross-linked to the point of complete decomposition).

Electron beam exposure step 44 imparts improved mechanical and etch stability to at least a portion of feature 50 (i.e., shell 58) or to feature 50 overall (depending on the extent of shell 56). Cross-linking causes densification such that shell 56 is denser and less porous than untreated region 62. Cross-linking also causes more polymer chains within feature 50 to form bonds with each other. Thus, cross-linking increases mechanical stability by increasing the interfacial toughness of the polymer bond between layers 30 and 28, and the bulk modulus and bulk toughness of feature 50. Due to such increased stability, feature 50 is also better able to survive etch processes and maintain pattern integrity therethrough (in other words, exhibit improved etch stability).

The degree of decomposition that the functional groups of the polymer material comprising layer 30 will undergo is a function of the dose of electron beam 51. In one embodiment, electron beam 51 is provided at a dose in the range of approximately 100 to 4000 μC/cm², and preferably, at a range of 1000 to 2000 μC/cm². The dose is selected to form shell 56 of sufficient toughness or hardness such that feature 50 is less likely to experience pattern bonding, breakage, or collapse during or as a result of resist trimming step 46 or underlying layer etching step 48.

The penetration depth of electron beam 51 into layer 30 is a function of the energy of electron beam 51. The penetration depth also determines the depth or thickness of shell 56. In one embodiment, the depth of shell 56 (e.g., the vertical thickness of treated top region 58) can be selected as a function of the accelerating voltage of electron beam 51. This relationship can be approximately expressed as:

$$R_g = \frac{0.046 V_a^{1.75}}{d}$$

where $R_g$ is the penetration depth in microns, $V_a$ is the accelerating voltage or energy in keV, and d is the density of the target material (e.g., layer 30) in g/cm³. Preferably, electron beam 51 is provided at a beam current on the order of approximately 3 mA and the accelerating voltage is provided at up to approximately 10 keV, and more preferably, in the range of approximately 3–5 keV.

Figure 6:
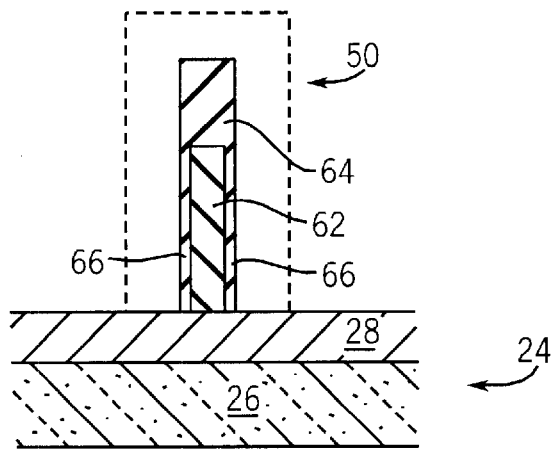
FIG. 6 is a cross-sectional view of the wafer illustrated in FIG. 5, showing a resist trimming step.

In any case, the vertical and horizontal depths associated with shell 56 are selected in accordance with throughput concerns, degree of feature stability desired, and/or extent of resist trimming step 46. Referring to FIG. 6, a cross-sectional view of a portion of wafer 24 upon completion of resist trimming step 46 is shown. Wafer 24 is exposed to a plasma etch, such as, a polysilicon etch or an oxide etch, to reduce or trim the lateral dimensions of features patterned on layer 30 (e.g., feature 50). For example, etch chemistries for a polysilicon etch include $HBr/Cl_2/O_2$ or $HBr/O_2$, and etch chemistries for an oxide etch are fluorine-based etch chemistries, such as, $C_4F_8/Ar/O_2$. In FIG. 6, the dotted line represents feature 50 before step 46.

Feature 50 after step 46 has lateral dimensions smaller than before step 46. Since the plasma etch of step 46 occurs on all exposed surfaces of layer 30, feature 50 is typically trimmed in both the vertical and horizontal directions. Trimmed feature 50 comprises a trimmed shell 64 and untreated region 62. Because not all of shell 56 was removed during step 46 (i.e., trimmed shell 64 remains), feature 50 will not experience mechanical deformation during or after step 46. In particular, sidewalls 66 of shell 64 provided at a vertical thickness on the order of nanometer thickness is sufficient to stabilize the trimmed feature 50, even when its aspect ratio is greater or equal to 3.0.

In order to provide the desired mechanical strength to feature 50 in association with step 46, the depth or thickness of shell 56 is selected such that at least a minimum depth of the cross-linked region will remain sufficient enough to prevent or minimize the occurrence of mechanical deformation of feature 50. Accordingly, the desired lateral dimension is a factor in determining the parameters of electron beam 51 in step 44. Another benefit of having shell 56 is that feature 50 may be aggressively trimmed without undue concerns of too much thinning of layer 30. Especially if feature 50 is cross-linked throughout its volume, the enhanced mechanical strength of trimmed feature 50 and bonding capacity with layer 28 ensures that pattern integrity will be maintained in even subsequent process steps, such as, underlying layer etching step 48.

After layer 30 has been trimmed, the trimmed features provided on layer 30 can be transferred to underlying layers of wafer 24, such as, layer 28, in underlying layer etching step 48. As shown in FIG. 7, trimmed feature 50 is etched into layer 28 to form a feature 68. Feature 68 is shaped similar to trimmed feature 50 and has a lateral dimension also similar to the lateral dimension of trimmed feature 50. Shell 64 of trimmed feature 50 also provides mechanical stability and strength to trimmed feature 50 undergoing step 48. Possible mechanical deformation is prevented and pattern integrity is maintained such that an accurate pattern transfer to underlying layers occurs. This ensures that IC devices comprised of such features will function reliably.

Figure 8:
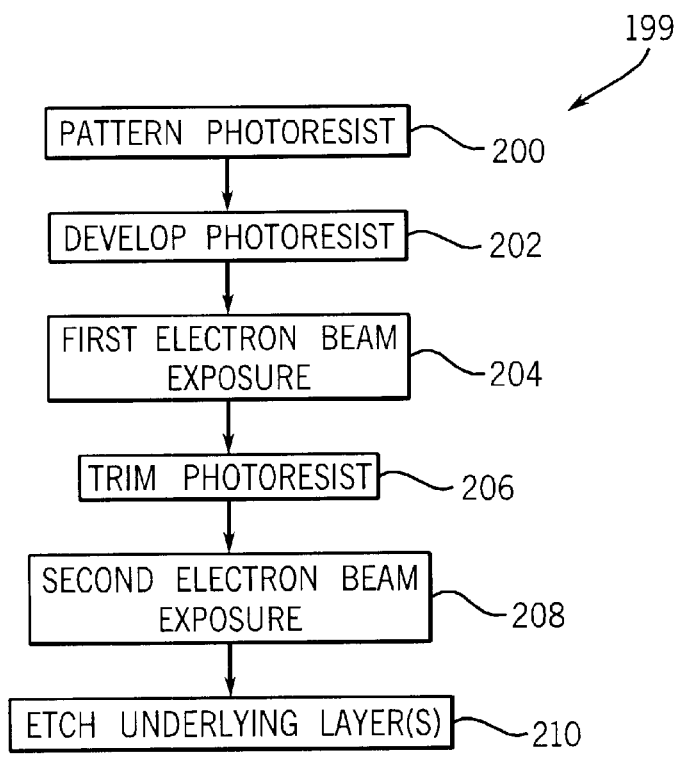
FIG. 8 is a process flow diagram showing the electron beam stabilization process in accordance with another exemplary embodiment.

In another embodiment, a process flow 199 shown in FIG. 8 includes a patterning step 200, a developing step 202, a first electron beam exposure step 204, a resist trimming step 206, a second electron beam exposure step 208, and an underlying layer etching step 210. The flow diagram of FIG. 8 illustrates treating wafer 24 to multiple electron beam exposures at various points along the IC fabrication process to prevent identified failure mechanisms (e.g., pattern bending, breakage, or collapse) associated with various etch processes. Wafer 24 is exposed to electron beam 51 (FIG. 5) in first electron beam exposure step 204.

Patterning step 200, developing step 202, first electron beam exposure step 204, and resist trimming step 206 are substantially similar to patterning step 40, developing step 42, electron beam exposure step 44, and resist trimming step 46, respectively. Referring to FIG. 9, a cross-sectional view of a feature 212 after completion of step 206 is shown. Feature 212 is comprised of a cross-linked region 214 and an untreated region 216. A dotted line 218 represents the feature before step 206 and a dotted line 220 represents cross-linked region 214 before step 206 (i.e., the original cross-linked region formed by the flood electron beam).

The original cross-linked region formed as a result of step 204 stabilizes feature 212 during at least trimming step 206 such that mechanical deformation is prevented, even when the aspect ratio of feature 212 is greater or equal to 3.0 and/or the photoresist material comprising feature 212 inherently has low mechanical stability.

Notice, however, that feature 212 in comparison to trimmed feature 50 (in FIG. 6) is comprised of a smaller or thinner cross-linked region. In process flow 199, the electron beam parameters associated with first electron beam exposure step 204 are configured to form a thinner cross-linked shell and/or having less etch resistance, or trimming step 206 is more prolonged or aggressive than trimming step 46. Hence enough of the original cross-linked region of feature 212 is removed by the end of step 206 so that feature 212 may undergo mechanical deformation in a subsequent etch process, such as, underlying layer etching step 210. For example, laterally trimming feature 212 to the point where all or almost all of the original cross-linked region at the sidewalls has been removed (as shown in FIG. 9) may result in an unstable feature, especially when its aspect ratio gets above 3.0.

Even in a situation where too much of desirable cross-linked regions are inadvertently lost during an etch process (e.g., trimming step 206) so that maintaining pattern integrity is at risk, features patterned on layer 30 can be restabilized or additionally cross-linked to withstand subsequent etch processes using additional electron beam treatments. Process flow 199, for example, provides second electron beam exposure step 208 after trimming step 206 to form an additional cross-linked region 222 in feature 212 (FIG. 10).

Wafer 24 is exposed to a flood electron beam 226, having characteristics similar to flood electron beam 51, to transform at least a portion of untreated region 216 into additional cross-linked region 222. The polymer functional groups of regions 214 and 222 are both cross-linked to the point of complete decomposition. Regions 214 and 222, collectively comprising a new cross-linked shell for feature 212, are configured to be of sufficient depth and hardness to prevent mechanical deformations during underlying layer etching step 210. Alternatively, electron beam 226 may be configured to transform all of untreated region 216 into a cross-linked region, making all of feature 212 cross-linked. In this instance, feature 212 will be extremely stable and exhibit high mechanical and etch stability.

Once layer 30 has undergone second electron beam exposure step 208, additional etch processes, such as, step 210, can be performed to transfer the patterned features (such as, trimmed feature 212) to one or more layers of wafer 24. In FIG. 11, features patterned on layer 30 are transferred to layer 28 via etching step 210. The stabilization imparted by regions 214 and 222 of feature 212 enables successful pattern transfer to occur without feature 212 becoming deformed.

Another benefit of process flow 199 is that feature 212 can be trimmed to much smaller dimensions than is conventionally possible. Cross-linking and decomposing the functional groups in the photoresist polymer makes such transformed regions (e.g., region 214) more impervious to etchant species, thereby making such regions more etch resistant than none cross-linked regions (e.g., region 216). Thus, the exposed surfaces of feature 212 that are not cross-linked will trim at a faster rate than the cross-linked surfaces such that the horizontal thickness removed from feature 212 will be greater than the vertical thickness removed.

In still another embodiment, features patterned on layer 30 may be treated with an electron beam in between a resist trimming process and an etching process involving underlying layers of wafer 24. Such treatment may be beneficial in situations where features patterned on layer 30 may survive the resist trimming process without deformations (e.g., a short or non-aggressive trimming) but may deform in subsequent etching process (e.g., due to certain etching parameters). By forming the cross-linked regions in the patterned features after trimming has been completed, care need not be taken to ensure that sufficient amounts of cross-linked regions are formed before the resist trimming process or that sufficient amounts of cross-linked regions remain after the resist trimming process.

Figure 12:
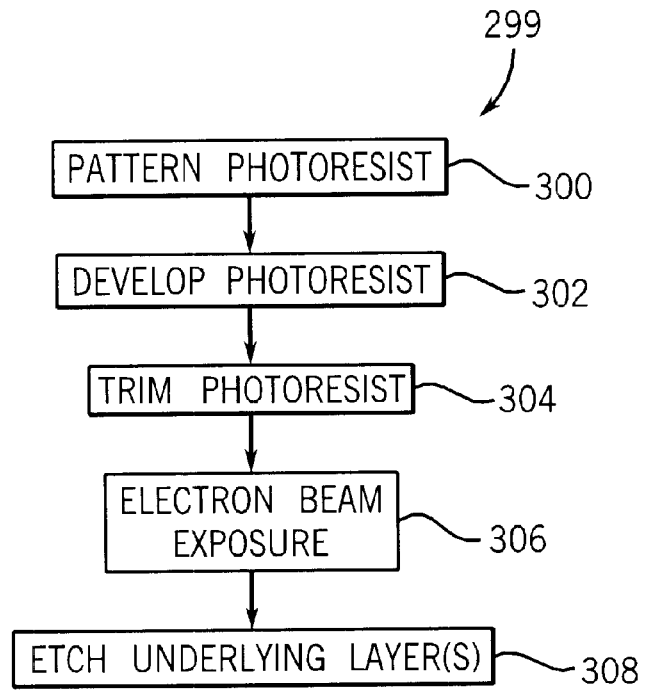
FIG. 12 is a process flow diagram showing the electron beam stabilization process in accordance with still another exemplary embodiment.
Figure 16:
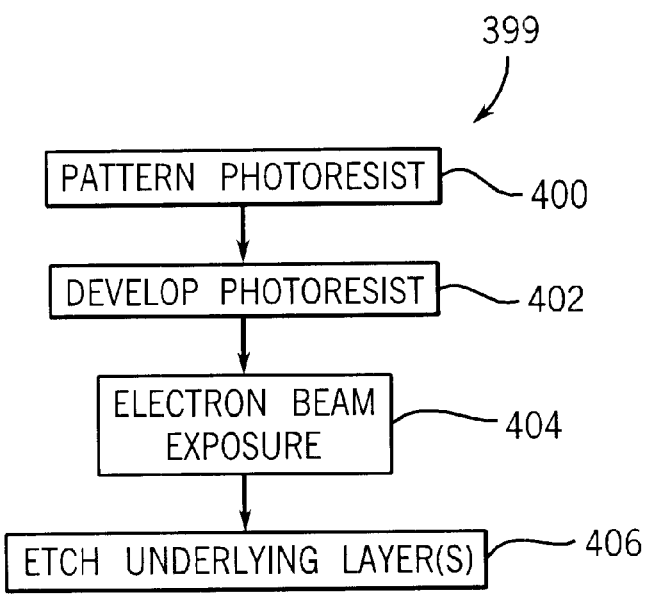
FIG. 16 is a process flow diagram showing the electron beam stabilization process in accordance with yet still another exemplary embodiment.

A process flow 299 shown in FIG. 12 includes a patterning step 300, a developing step 302, a resist trimming step 304, an electron beam exposure step 306, and an underlying layer etching step 308. Patterning step 300 and developing step 302 are substantially similar to patterning step 40 and developing step 42, respectively.

Figure 13:
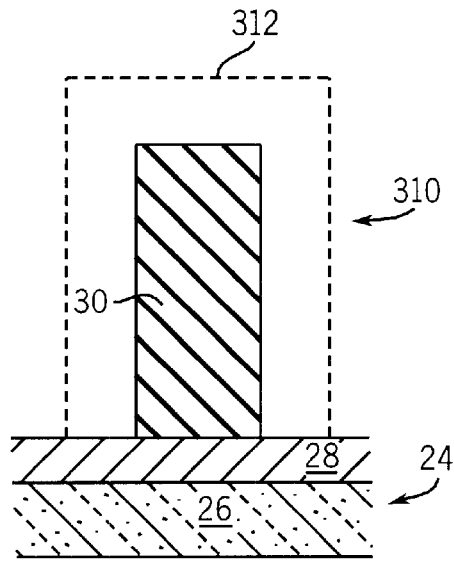
FIG. 13 is a cross-sectional view of a wafer, showing a resist trimming step.
Figure 14:
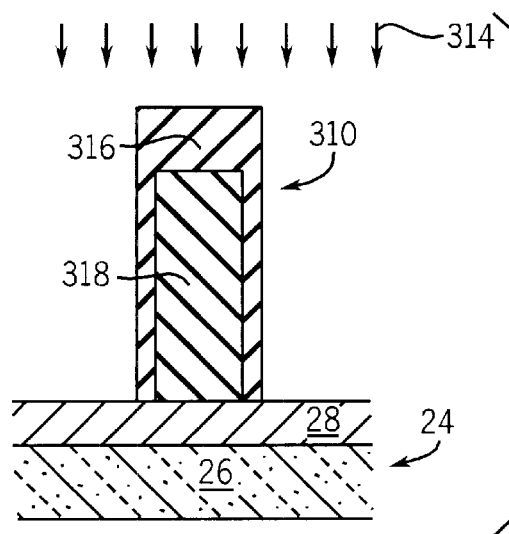
FIG. 14 is a cross-sectional view of the wafer illustrated in FIG. 13, showing an electron beam exposure step.

After developing step 302, a feature 310 is trimmed, preferably using a plasma etch, in trimming step 304. As shown in FIG. 13, a dotted line 312 represents the feature before step 304, i.e., feature 310 before trimming commenced. Next, in electron beam exposure step 306, feature 310 is cured by an electron beam 314 to cross-link at least a portion of feature 310. Feature 310 can be configured to comprise a cross-linked shell 316 and an untreated region 318 (shown in FIG. 14), region 318 encapsulated from underneath by layer 28 and on all other sides or faces by shell 316. Alternatively, all of feature 310 may be cross-linked (not shown), depending on the selected parameters of electron beam 314. Electron beam 314 is substantially similar to electron beam 51.

Figure 15:
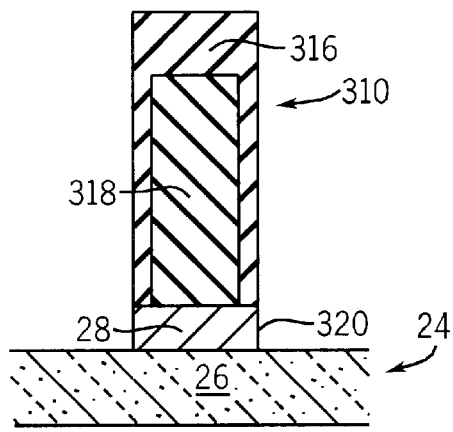
FIG. 15 is a cross-sectional view of the wafer illustrated in FIG. 14, showing an underlying layer etching step.

Preferably, the thickness and/or hardness of the cross-linked region (e.g., shell 316) of feature 310 is selected such that the likelihood of pattern deformation is decreased and/or etch stability is increased for underlying layer etching step 308. Hence, in FIG. 15, a feature 320 is successfully etched into layer 28 in step 308. Feature 320 has substantially the same dimensions as feature 310.

In yet still another embodiment, an electron beam is utilized to stabilize patterned features on a photoresist layer for etching such patterned features to an underlying layer of wafer 24. A process flow 399 (FIG. 16) includes a patterning step 400, a developing step 402, an electron beam exposure step 404, and an underlying layer etching step 406.

Figure 17:
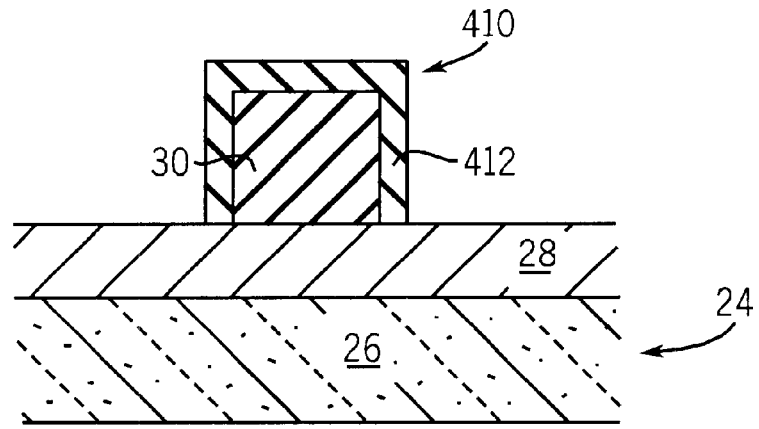
FIG. 17 is a cross-sectional view of a wafer, showing an electron beam exposure step.

Patterning step 400, developing step 402, and electron beam exposure step 404 are substantially similar to steps 40, 42, and 44, respectively. However, in step 404, the parameters of an electron beam 408 (FIG. 17) are selected to form cross-linked regions of layer 30 (e.g., a cross-linked shell 412 of a feature 410) sufficient to maintain pattern integrity during step 406. For example, the sidewalls of shell 412 may have a vertical thickness on the order of a nanometer. Alternatively, all of feature 410 may be cross-linked (not shown).

Figure 18:
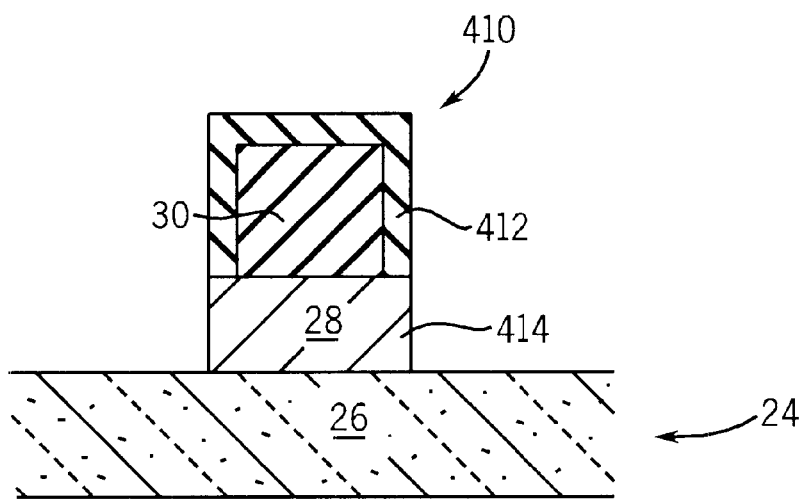
FIG. 18 is a cross-sectional view of the wafer illustrated in FIG. 17, showing an underlying layer etching step.

After step 404, the pattern of feature 410 is transferred to an underlying layer of wafer 24, such as, layer 28, in step 406. FIG. 18 shows a feature 414 etched into layer 28 having substantially the same dimensions as feature 410. By stabilizing feature 410 with electron beam 408, feature 410 maintains pattern integrity through step 406 even when it has been an aspect ratio greater or equal to 3.0. Alternatively, even when a thinner layer of layer 30 is initially provided on wafer 24 (e.g., a thickness greater than 300 nm), etching consumption typical in etch processes, such as, step 406, is reduced so that enough of the pattern remains for a subsequent processing.

In this manner, features patterned on a photoresist layer can be stabilized as needed (i.e., prior to etch process(es) likely to cause pattern failure); by a controllable amount (e.g., controlling the thickness and hardness of the cross-linked regions in layer 30); and/or depending on the dimensions and material characteristics of the patterned features. Moreover, electron beam stabilization can be applied one or more times at various points within the IC fabrication process. Electron beam stabilization offers a great deal of flexibility and benefits with minimal cost or throughput issues.

It is understood that although the detailed drawings, specific examples, and particular values describe the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Various modifications may be made in the details disclosed without departing from the spirit of the invention as defined in the following claims.

What is claimed is:

1. An integrated circuit fabrication process, the process comprising:
   first stabilizing a feature patterned on a photoresist layer by electron beaming, the photoresist layer disposed above a substrate;
   trim etching the photoresist layer, wherein the first stabilizing step is performed before the trim etching step and the feature patterned on the photoresist layer at the etching step has an aspect ratio greater or equal to 3.0, a vertical thickness greater than 300 nm, or is comprised of an acrylate, alicyclic, or cyclo-olefin based polymer;
   second stabilizing the feature after the trim etching step by electron beaming; and etching a layer above the substrate or the substrate after the second stabilizing step.

2. The process of claim 1, wherein the trim etching step includes trimming the feature patterned on the photoresist layer.

3. The process of claim 1, wherein the trim etching step includes patterning the substrate with the feature patterned on the photoresist layer.

4. The process of claim 1, wherein the first stabilizing step includes cross-linking and decomposing at least a portion of the feature patterned on the photoresist layer to form a cross-linked region of the feature.

5. The process of claim 4, wherein the cross-linked region prevents the feature from at least one of bending, breaking, collapsing, and deforming during the etching step.

6. The process of claim 4, wherein a thickness of the cross-linked region is at least 10% of a lateral dimension of the feature.

7. A method of maintaining pattern integrity during an integrated circuit fabrication, the integrated circuit fabrication including a feature patterned on a photoresist layer and at least one potentially pattern deforming processing step, the method comprising:

preventing the feature patterned on the photoresist layer from deforming using a flood electron beam, wherein the feature patterned on the photoresist layer is selectively exposed to the flood electron beam before the at least one potentially pattern deforming processing step;

configuring conditions of the flood electron beam depending on a type of material comprising the photoresist layer, characteristics of the at least one potentially pattern deforming processing step, a vertical thickness of the photoresist layer, or a lateral dimension of the feature patterned on the photoresist layer;

trim etching the feature to reduce the lateral dimension of the feature; and stabilizing the feature after the trim etching step by using another flood electron beam.

8. The method of claim 7, wherein the conditions of the flood electron beam are selected from a group including at least one of a beam current, an accelerating voltage, and a dose.

9. The method of claim 7, wherein the preventing step includes cross-linking at least a portion of the feature patterned on the photoresist layer to form a cross-linked region of the feature.

10. The method of claim 9, wherein the cross-linked region includes a top region of the feature.

11. The method of claim 9, wherein the cross-linked region comprises at least 10% of the feature.

12. The method of claim 7, wherein the at least one potentially pattern deforming processing step is selected from a group including a resist trimming process step and an etch processing step of an underlying layer of a wafer.

13. A method of fabricating feature patterned on a photoresist layer, the method comprising:

first stabilizing the feature patterned on the photoresist layer by electron beaming, the photoresist layer disposed above a substrate;

first etching the photoresist layer, wherein the first stabilizing step is performed before the first etching step;

second stabilizing the feature by electron beaming; and second etching a layer above the substrate or the substrate.

14. The method of claim 13, wherein the electron beaming forms a cured region by exposing the feature to a uniform collimated flood electron beam.

15. The method of claim 14, wherein the flood electron beam is provided at a dose in the range of approximately 100–4000 $\mu C/cm^2$ an accelerating voltage in the range of approximately 3–10 keV, and a beam current in the range of approximately 3–15 mA.

16. The method of claim 14, wherein the cured region includes a top region of the feature.

17. The method of claim 16, wherein the cured region includes sidewalls of the feature.

18. The method of claim 14, wherein the first etch process is a resist trimming process.

19. The method of claim 14, wherein the photoresist layer is comprised of a material used in 193 nm or shorter wavelength lithography.

20. The method of claim 14, wherein an aspect ratio of the feature before, during, or after the subsequent etch process is greater or equal to 3.0.

* * * * *